(12) United States Patent
Kozakiewicz

(10) Patent No.: US 6,510,058 B1
(45) Date of Patent: Jan. 21, 2003

(54) PRINTED CIRCUIT BOARD CONFIGURATION HAVING REDUCED EMC/EMI INTERFERENCE IN ELECTROMECHANICAL RELAY CIRCUITS

(75) Inventor: Raymond Kozakiewicz, Burlington, MA (US)

(73) Assignee: Sensormatic Electronics Corporation, Boca Raton, FL (US)

( * ) Notice: Subject to any disclaimer, the term of this patent is extended or adjusted under 35 U.S.C. 154(b) by 115 days.

(21) Appl. No.: 09/616,416

(22) Filed: Jul. 14, 2000

(51) Int. Cl.[7] .................................................. H05K 7/02
(52) U.S. Cl. ...................... 361/760; 361/794; 361/776; 361/828; 361/785; 200/292; 335/88; 335/119
(58) Field of Search ................................. 361/760, 761, 361/794, 785, 819, 776, 781, 790, 828, 721; 335/88, 119, 184; 200/292

(56) References Cited

U.S. PATENT DOCUMENTS

| 5,160,807 | A |   | 11/1992 | Fry et al. ...................... 174/35 |
| 5,323,299 | A |   | 6/1994  | Weber .......................... 361/818 |
| 5,374,792 | A | * | 12/1994 | Ghezzo et al. ............. 200/16 B |
| 5,467,068 | A | * | 11/1995 | Field et al. ..................... 335/4 |
| 5,475,606 | A |   | 12/1995 | Muyshondt et al. ......... 364/489 |
| 5,523,921 | A | * | 6/1996  | Van Lydegraf ............. 361/818 |
| 5,719,750 | A |   | 2/1998  | Iwane .......................... 361/794 |
| 5,811,050 | A |   | 9/1998  | Gabower ..................... 264/299 |
| 5,847,631 | A | * | 12/1998 | Taylor et al. .................. 335/78 |
| 5,917,708 | A |   | 6/1999  | Moran et al. ............... 361/800 |
| 5,955,704 | A |   | 9/1999  | Jones et al. ................. 174/262 |

* cited by examiner

Primary Examiner—David S. Martin
Assistant Examiner—Hung Bui
(74) Attorney, Agent, or Firm—Rick F. Comoglio

(57) ABSTRACT

Isolated planar conductive structures on separated layers of a PCB provide the normally-open, common, and normally-closed components of an electromechanical relay circuit to minimize inductive area. The isolated planar configuration reduces coupling of relay contact-noise currents to nearby sensitive circuits, and minimizes coupling EMI energy from nearby logic or microprocessor circuits to the relay contact circuits.

12 Claims, 11 Drawing Sheets

PRINTED CIRCUIT BOARD CONFIGURATION HAVING REDUCED EMC/EMI INTERFERENCE IN ELECTROMECHANICAL RELAY CIRCUITS

CROSS REFERENCES TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

This invention relates to a printed circuit board (PCB) configuration, which improves the electromagnetic compatibility/electromagnetic interference (EMC/EMI) performance of electromechanical relay circuits.

2. Description of the Related Art

Relay devices frequently switch large currents into inductive loads. Contact bounce and circuit interruption result in high back-EMF voltages and large currents across the relay contact. The relay contact essentially forms a spark gap with quenching performance that varies with the movement of the relay armature. Consequently, a whole spectrum of high-energy noise is created that is well known to be disruptive to logic and microprocessor circuits.

The inductive load circuits controlled by relay contacts are normally located outside the enclosure of the controlling logic, and some distance away. Because of the proximity of the relays to logic and microprocessor circuits, inductive and capacitive coupling mechanisms may exist which will introduce radio-frequency noise onto the relay circuits. The wiring for the logic circuits form antennas that will radiate any noise energy that may be present onto the relay circuits.

Referring to FIGS. 1 and 2, in classical analysis of EMC problems, there is always a source 2, a victim 4, and a coupling mechanism 6. The mechanism of inductively coupled noise and the current methods used to minimize its impact is discussed hereinbelow. Analogies can be drawn using an air-core radio-frequency (RF) transformer as the coupling mechanism 6. Analysis shows that the strength of the inductive coupling depends upon the mutual inductance. A circuit loop on a PCB will behave like a single-turn transformer. The source device circuit loop 3 will couple to the circuit loop 5 of the victim. Various techniques are currently employed to deliberately reduce the coupling effect of the PCB transformer.

Referring to FIGS. 3 and 4, the disruptive effects of relay contact circuits on logic and microprocessor circuits have been controlled by segregation of relay contact circuits 8 and electronic logic circuits 10. Segregation simply separates the sensitive logic circuits 10 from the larger currents switched by the relay circuits 8 and the resultant magnetic flux 12. Wiring loop 13 acts like a coupling transformer for magnetic flux 12.

Referring to FIG. 5, at times segregation includes separate PCBs 14 and 16, and partitioning the system with a magnetic shield 18 made of a ferrous material between the relay circuits 8 and the logic circuits 10. The magnetic shield 18 provides a low-reluctance path for the magnetic flux 12, containing it largely within the shield 18 sub-enclosure. Segregation approaches have been successful, but they require a product to be large and bulky, and accessibility for product service can be compromised.

EMI filters have been used to reduce noise that is directly conducted by the signal wiring. Such devices are presently available off-the-shelf as line filters for power supply applications. These devices are often bulky because relay contact circuits are normally required to handle large currents. EMI filters can be connected to the wiring loop 13 shown in FIG. 3.

Referring to FIGS. 6 and 7, presently available metal oxide varister (MOV) devices can be used that reduce inductive kickback voltages resulting from interrupting the current to user-connected equipment. They also define the path of the inductive-discharge currents to limit the disruptive effects to nearby electronic circuits. MOV devices are compact and cost effective, but have a finite service life. However, by diverting the energy away from the relay contacts, the service life of the relay can be increased. FIG. 6 illustrates a circuit without an MOV device in which a large discharge current 20 passes through the relay contact 9. The noise generated in the spark gap (relay contact 9) couples inductively to nearby logic circuits. FIG. 7 illustrates a circuit using an MOV device 22 in which discharge current 21 is much smaller than discharge current 20 because the energy is diverted through the MOV device 22. Smaller discharge current 21 results in a smaller noise current and less potential disruptions of nearby logic circuits.

Referring to FIG. 8, placing the forward and return traces for the relay contacts on closely spaced parallel conductors 24 reduces the inductive area of the PCB circuit and thus reduces inductive coupling in comparison to wiring loop 13 shown in FIG. 4. A further enhancement of this technique places the two paths of the circuit on opposite sides of the PCB. This reduces the inductive area to the thickness of the PCB.

Referring to FIG. 9, the use of multilayer boards 25 has been found to greatly reduce the EMI generated by PCBs. Top wiring or etched layer 26 contains the signal wiring traces 28 and associated logic circuits 10. The ground and power planes 30 are separated by insulation, and a bottom wiring/etched layer 31 can be included. The ground and power planes 30 allow the return currents 32 to form directly adjacent to each signal line 28, with each return circuit 32 finding the path of least impedance that closely mirrors each signal trace 28. The signal traces 28 and these mirror currents 32 form the smallest inductive area and thus minimize the effects of inductive coupling and electromagnetic disturbances. The path of least impedance for rapid changing currents is the path that forms the smallest inductive area, directly under the signal trace. The mirror currents automatically form the paths that achieve minimum inductive coupling. If the signal path must cross a gap in the planes, the mirror currents are forced to form a larger area and generate much more inductive noise.

Referring to FIG. 10, when a toggling logic output drives a logic input, there is a finite return current 34. The return current 34 moves through the ground path 36. If a cable 38 is connected to the driven gate, even on the logic chip ground lead, it will become an antenna radiating RF energy. The ground path 36 forms an inductor with small but finite inductance. This distributed inductance forms an autotransformer. The finite currents changing in the finite inductance produce voltages 39 on the connected cable that may radiate several milliwatts of power.

The autotransformer coupling mechanism described above is generally termed common impedance coupling.

The 3 or 5-volt logic transitions are not the problem. If the toggling output of a logic gate was directly connected to twisted-pair of unshielded cable it would produce less radiated noise than in the above example. This is because the return line currents are always the precise equal and opposite of the signal line currents. The balanced (equal and opposite) fields produced by these differential currents on the twisted-pair cable are forced to cancel each other and will not produce strong EMI.

By reducing the effect of the inductive and electric field coupling mechanisms, both electrical immunity and EMC/EMI performance are greatly enhanced.

BRIEF SUMMARY OF THE INVENTION

A first aspect of the invention provides a multilayered printed circuit board for mounting a relay thereon and having a first layer with an electrically conductive plane for electrical connection to a common armature contact of the relay. The electrically conductive plane is sized to substantially cover the mounting footprint of the relay. A second layer parallel to and electrically separate from the first layer has an electrically conducting first section for electrical connection to a normally-open contact of the relay and an electrically conducting second section for electrical connection to a normally-closed contact of the relay. The first and the second sections are electrically separate from each other and in combination with each other are planar and sized to substantially cover the mounting footprint of the relay.

For mounting a plurality of relays, the first layer includes a plurality of the electrically conductive planes, each being electrically separate form each other. The second layer includes a plurality of the electrically conductive first and second sections, one pair each corresponding to each of the electrically conductive planes in the first layer, and each of the electrically conductive first and second sections are electrically separate form each other. A third layer parallel to and electrically separate from the first and second layers can be added. The third layer is electrically conductive and electrically connected to ground to form a faraday shield.

A second aspect of the invention provides a multilayered printed circuit board for mounting a relay thereon and having a first layer with a first electrically conductive plane for electrical connection to a common armature contact of the relay. The first electrically conductive plane is sized to substantially cover the mounting footprint of the relay. A second layer is parallel to and electrically separate from the first layer. The second layer has a second electrically conductive plane for electrical connection to a normally-open contact of the relay.

The second electrically conductive plane is sized to substantially cover the mounting footprint of the relay. A third layer is parallel to and electrically separate from the first and second layers and has a third electrically conductive plane for electrical connection to a normally-closed contact of the relay. The third electrically conductive plane is sized to substantially cover the mounting footprint of the relay.

For mounting a plurality of relays thereon, the first layer has a plurality of the first electrically conductive planes, each being electrically separate form each other. The second layer has a plurality of said second electrically conductive planes, each being electrically separate form each other. The third layer has a plurality of the third electrically conductive planes, each being electrically separate form each other. One each of the first, second, and third electrically conductive planes are associated with one each of the plurality of relays. A fourth layer can be added that is parallel to and electrically separate from the first, second, and third layers.

The fourth layer is electrically conductive and electrically connected to ground to form a faraday shield.

The above aspects of the invention can include relays and logic circuit components mounted on the inventive multi-layered PCB. And can include relays mounted on the inventive multilayered PCB and an adjacent conventional PCB having the logic circuit components mounted thereon.

Objectives, advantages, and applications of the present invention will be made apparent by the following detailed description of embodiments of the invention.

DETAILED DESCRIPTION OF THE INVENTION

Figure 1:
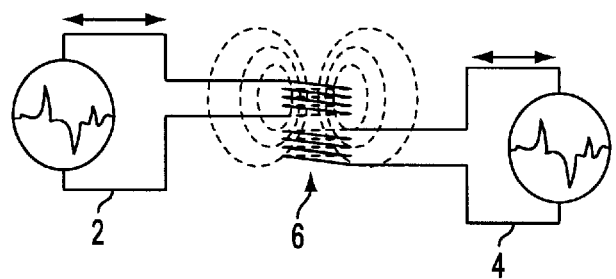
FIG. 1 is a prior art schematic of a circuit showing an air-core transformer as the coupling mechanism for EMC/EMI interference.
Figure 2:
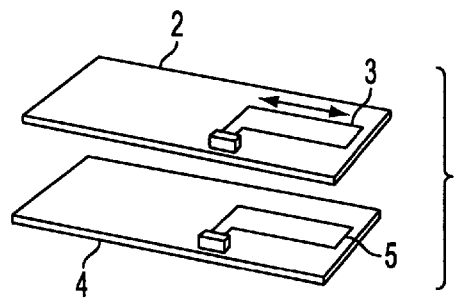
FIG. 2 is a prior art schematic showing a foil loop on a PCB that can behave like a single-turn transformer.
Figure 3:
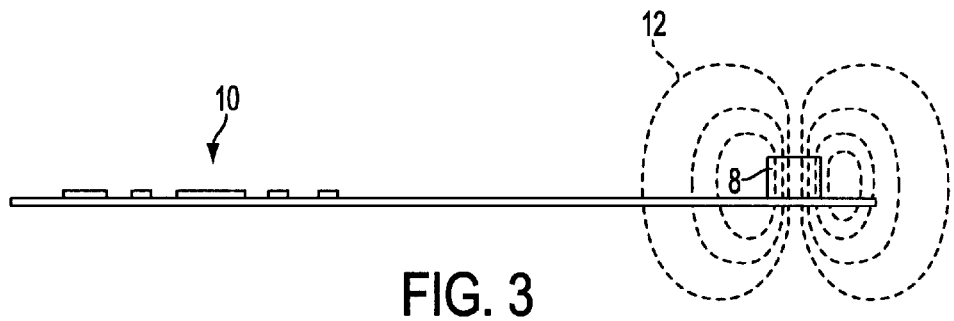
FIG. 3 is a schematic showing a prior art solution to EMC/EMI using segregation.
Figure 4:
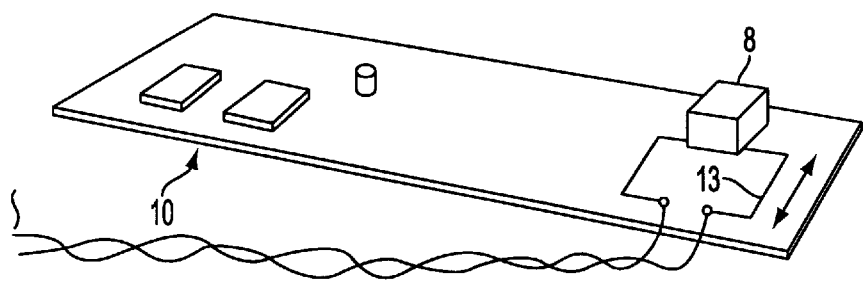
FIG. 4 is a schematic showing a noise coupling mechanism for the EMC/EMI of FIG. 3.
Figure 5:
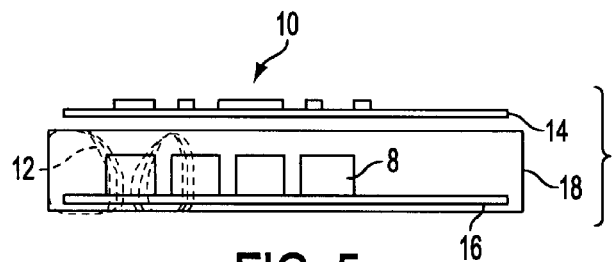
FIG. 5 is a schematic showing another prior art solution to EMC/EMI using shielding.
Figure 6:
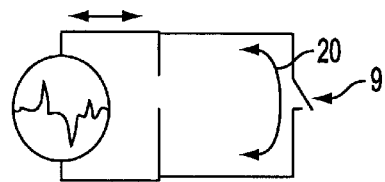
FIGS. 6 and 7 are prior art schematics that, in conjunction with each other, illustrate the effects of using an MOV device to reduce EMI.
Figure 7:
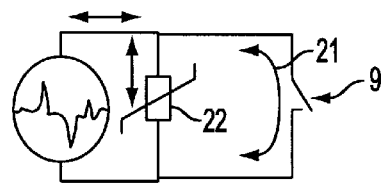
Figure 8:
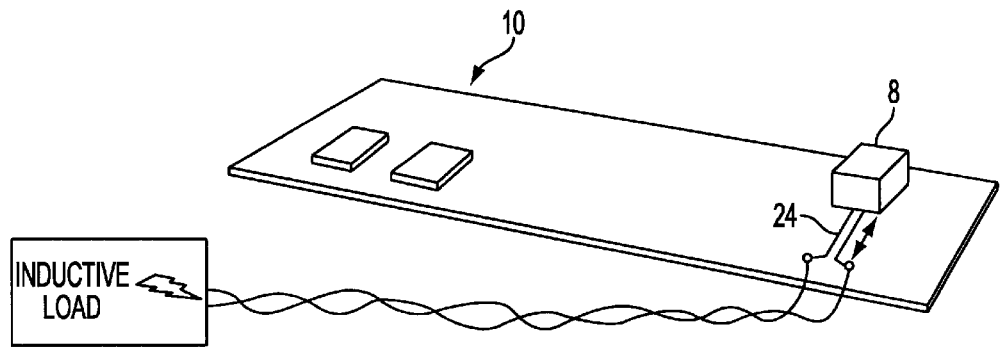
FIG. 8 is a prior art schematic showing a method to reduce the coupling mechanism for EMC/EMI.
Figure 9:
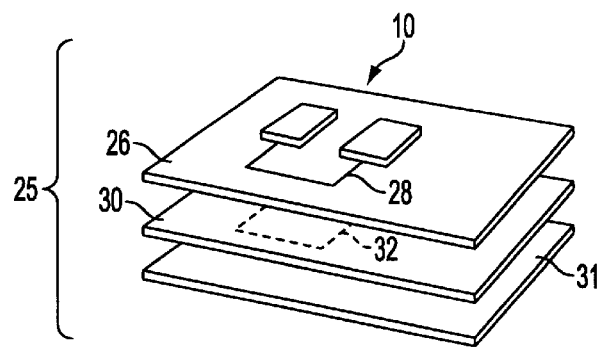
FIG. 9 is a schematic showing another prior art solution to EMC/EMI using a multi-layered PCB.
Figure 10:
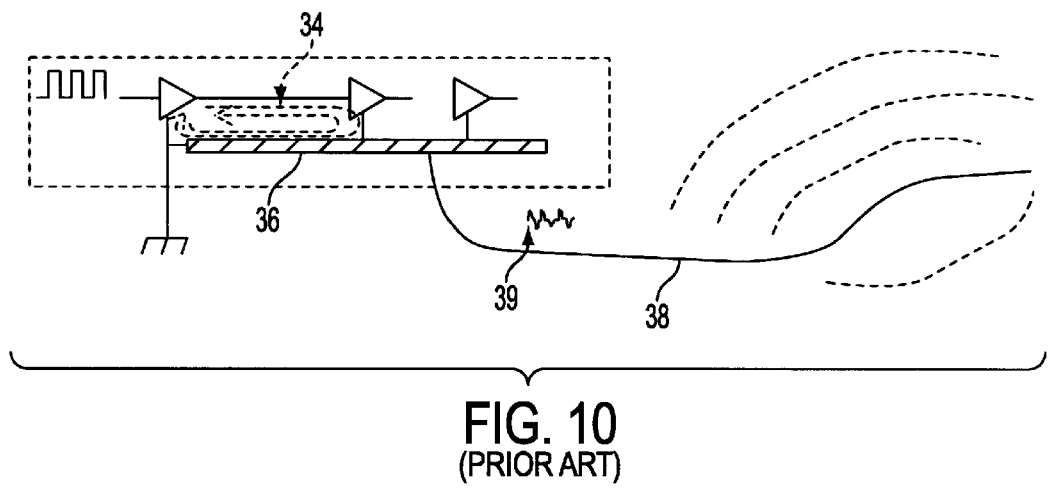
FIG. 10 is a prior art schematic showing a coupling mechanism for EMI from logic circuits.
Figure 11:
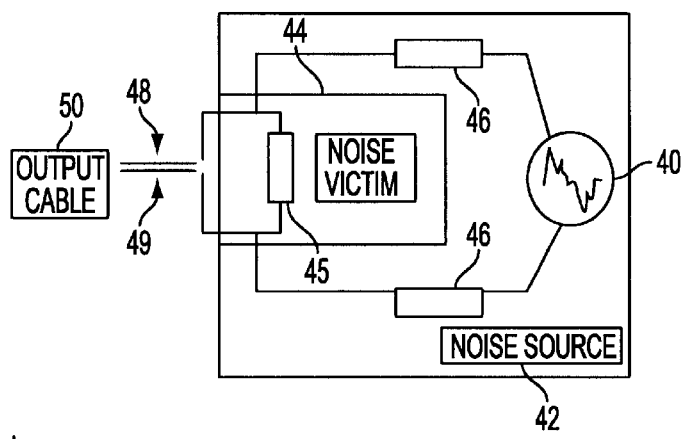
FIG. 11 is a schematic showing a generalized coupling mechanism for EMI.

Referring to FIG. 11, the differential noise 40 from the noise source board 42 inductively couples to the noise victim board 44. In one embodiment, noise victim board 44 includes at least one relay 45, and noise source board 42 includes a logic circuit. When the attenuation through the stray impedances 46 is equal for both the signal line 48 and return line 49, at each and every frequency, the output cable 50 will radiate very little noise. Balanced differential noise currents in the output cable are relatively harmless. But any imbalance through the stray impedances 46 results in net common-mode energy, which will cause strong radiated noise. As fully described hereinbelow, the conductive circuit contact planes used for the relay circuit are identical. The inductive component of the stray impedance is thus minimized and precisely balanced. The planes are close together, so the capacitive components of the impedance are nearly identical. The common-impedance noise that can be generated at the circuit connector is minimized.

Figure 12:
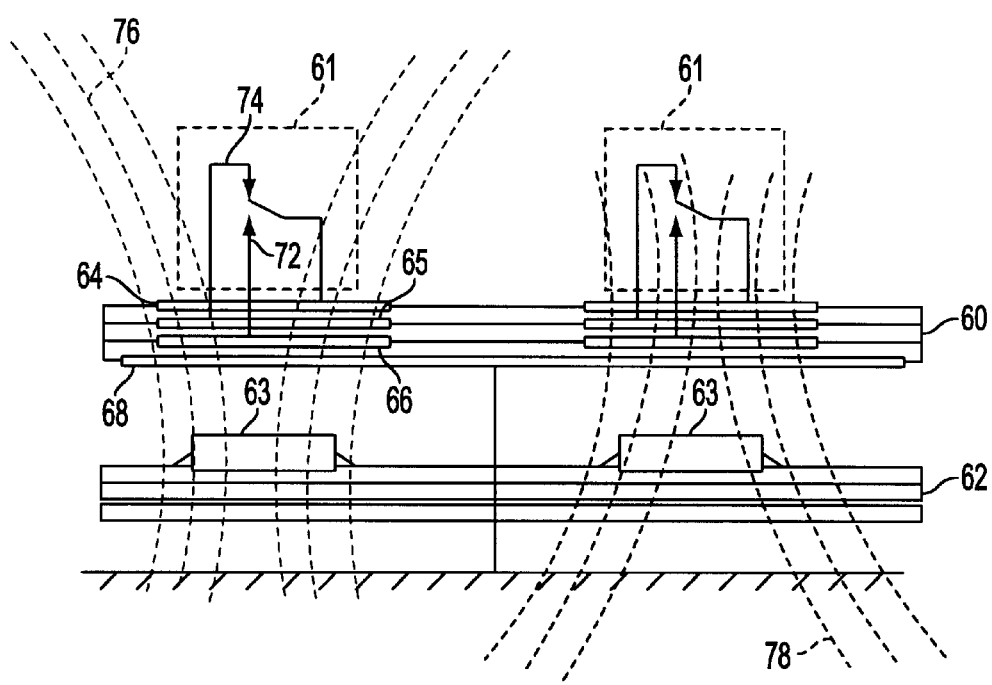
FIG. 12 is a schematic of one embodiment of the present invention.

Referring to FIG. 12, inventive multilayer relay PCB 60, having one or more relays 61, is positioned adjacent and over logic PCB 62, which has one or more logic components 63. Relay PCB 60 has separate conductive contact planes for common 64, normally-open 66, and normally-closed 65 connections, and a grounded plane forming a conventional faraday shield 68. Separate common 64, normally-open 66, and normally-closed 65 planes that correspond to each relay's common armature 70, normally-open 72, and normally-closed 74 contacts, respectively are each on a separate layer of PCB 60. Magnetic fields 76 and 78 are generated by the logic 63, and relay 61 circuits, respectively.

Forming the relay contact wiring into separate planes (normally-open 66, normally-closed 65, and common 64) for each component of the contact circuit (normally-open 72, normally-closed 74, and common 70) minimizes mutual-inductive coupling between the relay contact circuits on PCB 60 and any electronic circuit on PCB 62. It is well known that high-frequency currents will find the path of least impedance. The several contact planes for each relay assure that the least-impedance path found will also be a very low-impedance path with minimal area, and thus minimal inductive coupling to external circuits.

Each contact circuit plane associated with a relay 61 is separated from other relay contact circuits that may be nearby. A faraday shield 68 can be fashioned using a conventional grounded plane. The incidental distributed capacitance of the contact circuit planes may further attenuate high-frequency energy.

Figure 13:
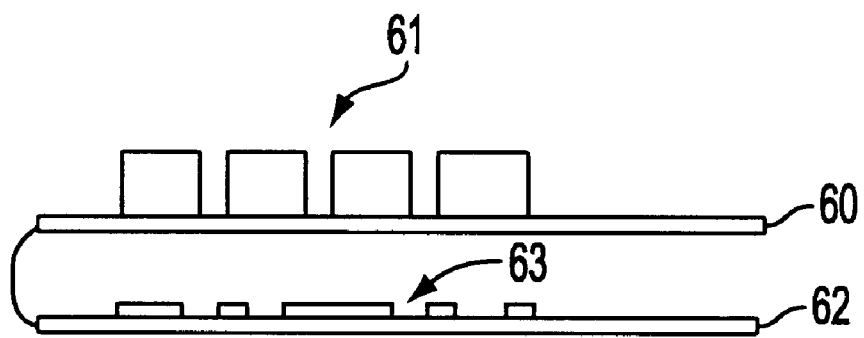
FIG. 13 is a side elevation view of one embodiment of the present invention.
Figure 14:
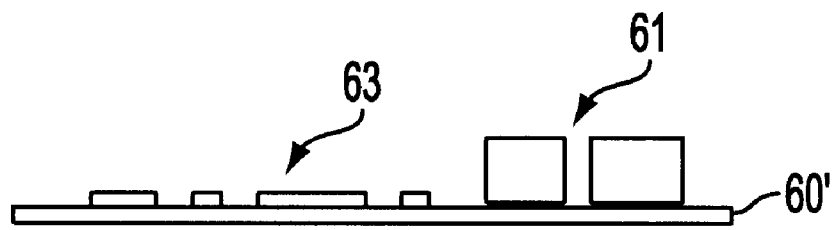
FIG. 14 is a side elevation view of an alternate embodiment of the present invention.
Figure 15A:
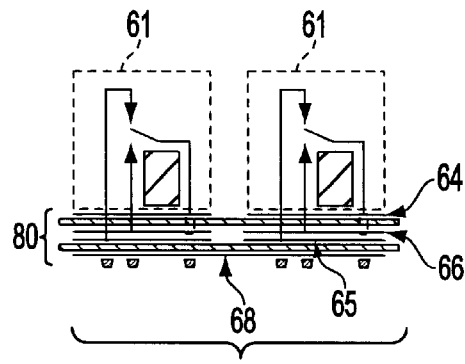
FIG. 15A is a schematic of another embodiment of the present invention.
Figure 15B:
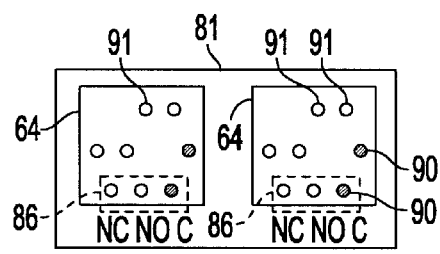
FIGS. 15B–15E are schematics of the layers of the invention shown in FIGS. 12 and 15A.
Figure 15C:
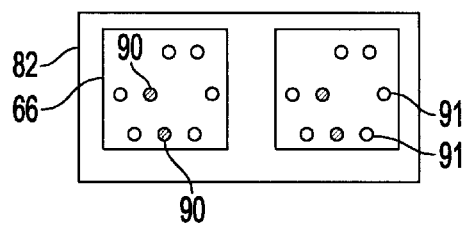
Figure 15D:
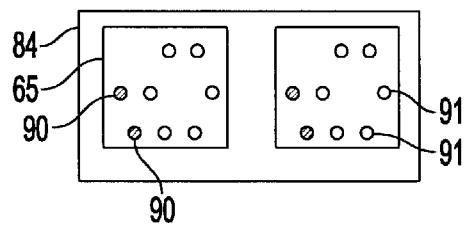
Figure 15E:
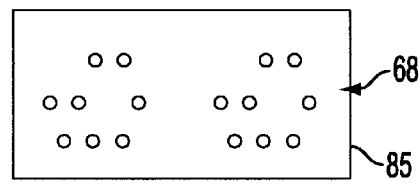

Referring to FIG. 13, PCB 60 is illustrated over logic PCB 62, which is one of the worst case orientations for EMC/EMI. PCB 60 and 62 can be electrically connected or electrically separate. PCB 60 and 62 can be positioned in other orientations such as side-buy-side. The relay 61 and logic components 63 can be combined on a single PCB 60', as shown in FIG. 14. PCB 60' includes multiple layers as described herein under the relays 61.

Referring to FIGS. 15A–15E, separate layers 81, 82, 84, and 85 of PCB 80 are illustrated showing the common 64, normally-open 66, and normally-closed 65 contact planes, and the ground plane 68, respectively. PCB connector 86 is also illustrated. The conductive contact planes for common 64, normally-open 66, and normally-closed 65 connections are sized, at a minimum, large enough to cover the mounting footprint of relay 61. The mounting footprint of a relay is simply the area below the relay when mounted on a PCB. The conductive contact planes can be made larger to cover PCB connector 86, as illustrated, and made even larger to cover additional interconnected components (not shown). Circuit connections 90, and pass through connections 91 are illustrated to indicate representative solder connections to the various contact planes. PCB 60, shown in FIG. 12, and PCB 81 differ only in the physical position of the normally-open 66 and normally-closed 65 contact planes within the PCB. Using a single plane for the relay armature 70 (common) circuit and separate planes for the normally-open 72 and normally-closed 74 circuit connections assure that the relay circuit is not a channel for emission of RF energy from nearby electronic circuits, and that nearby electronic circuits maintain high immunity from noise on the relay circuits.

Figure 16A:
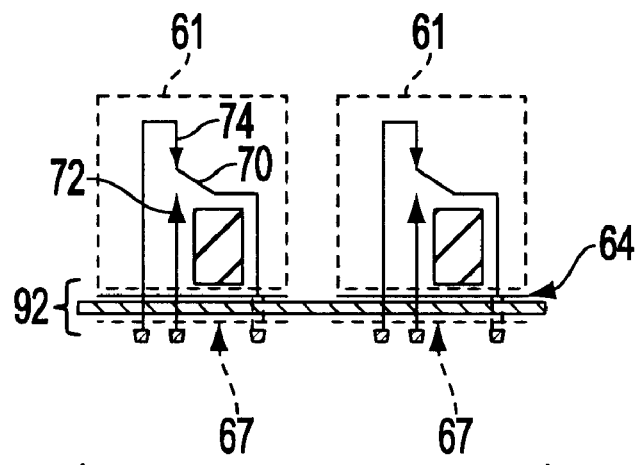
FIG. 16A is a schematic of another embodiment of the present invention.
Figure 16B:
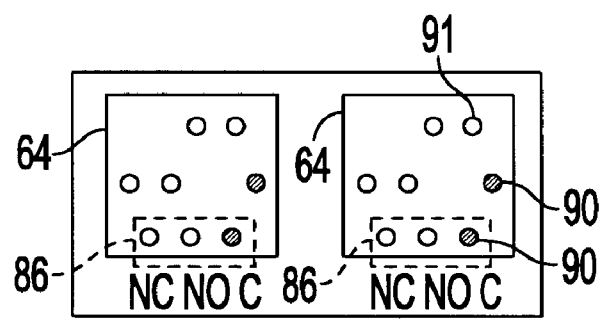
FIGS. 16B–16C are schematics of the layers of the invention shown in FIG. 16A.
Figure 16C:
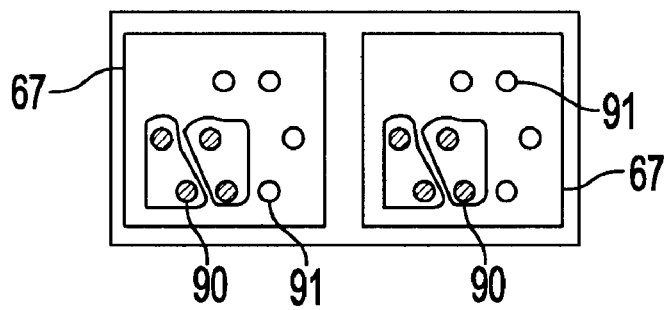

Referring to FIGS. 16A–16C, another embodiment of the present invention is illustrated using a single plane for the relay armature 70 (common) circuit to assure nearby electronic circuits maintain high immunity from noise on the relay contact circuits. When several relays 61 are used, each has its own common plane 64. This configuration may be implemented on a two-sided PCB 92. PCB traces 67 for the normally-open 72 and normally-closed 74 contact circuits are routed on the side of the board opposite the common plane 64. The common plane 64 provides a route for the return currents of the normally-open 72 and normally-closed 74 contacts. The mirror currents find the lowest inductance path to minimize coupling effects.

Figure 17:
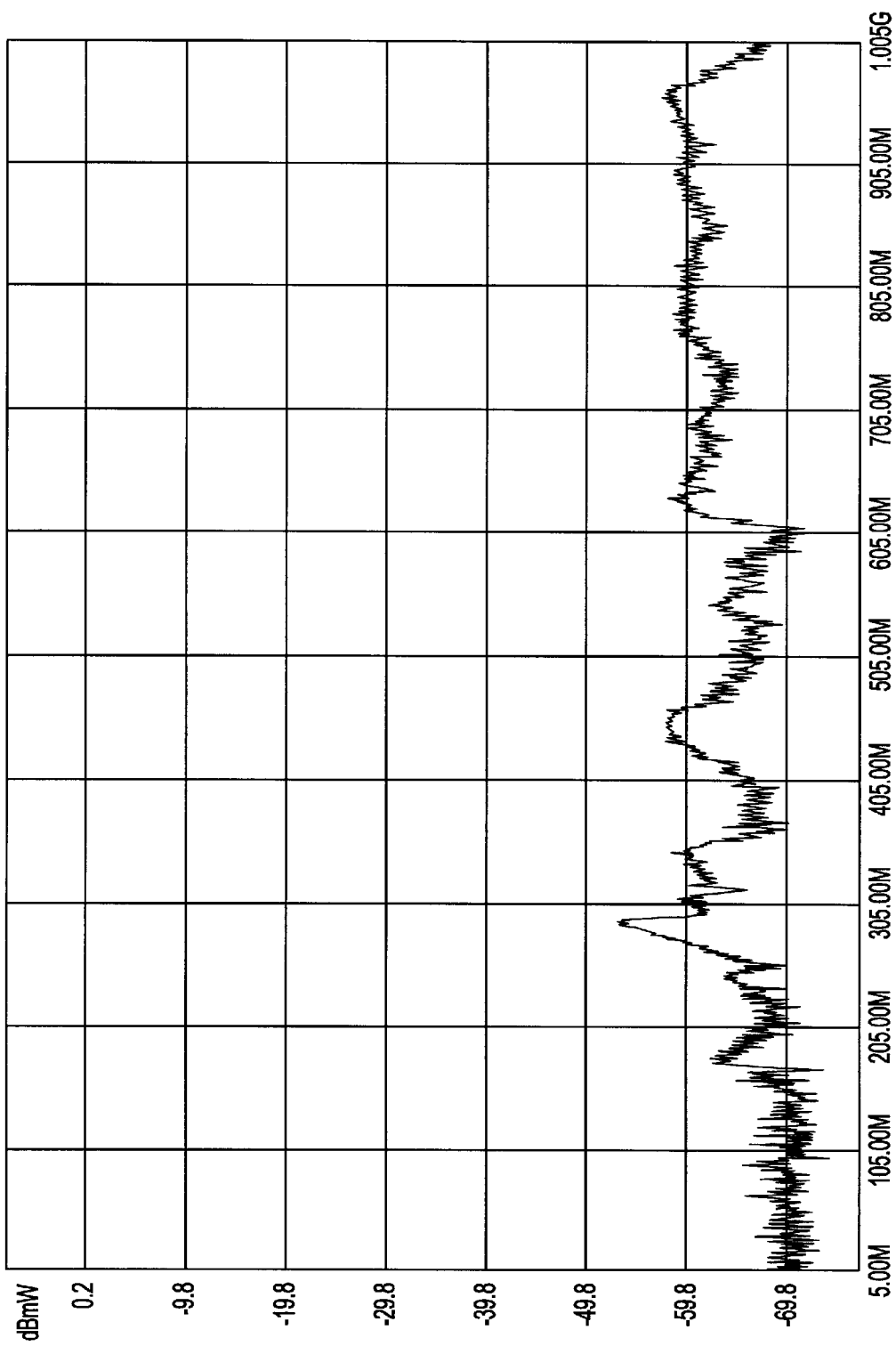
FIGS. 17–19 are graphs of the ambient noise, and the noise associated with a conventional PCB and the invention, respectively, for a comparison noise test.
Figure 18:
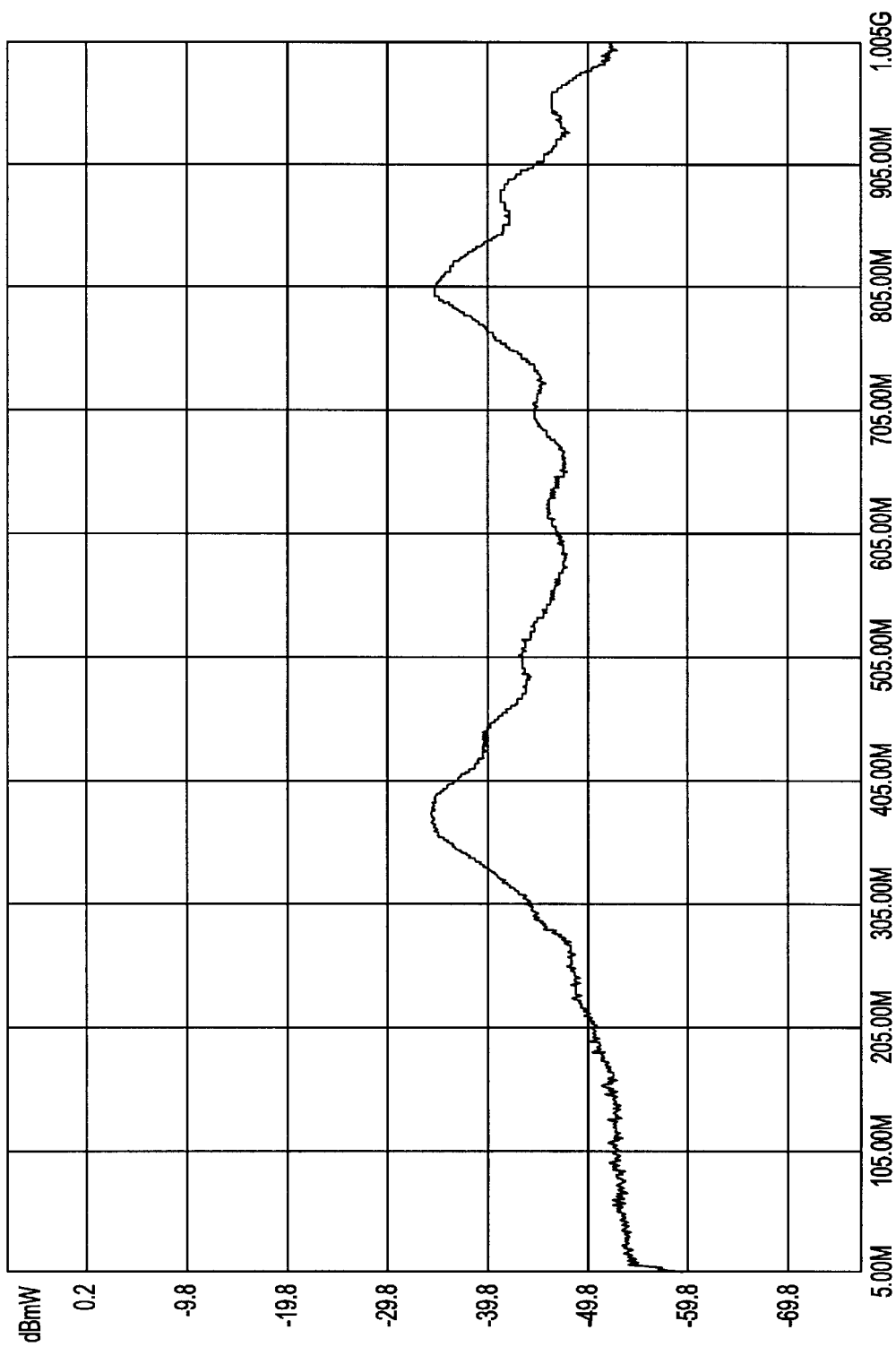
Figure 19:
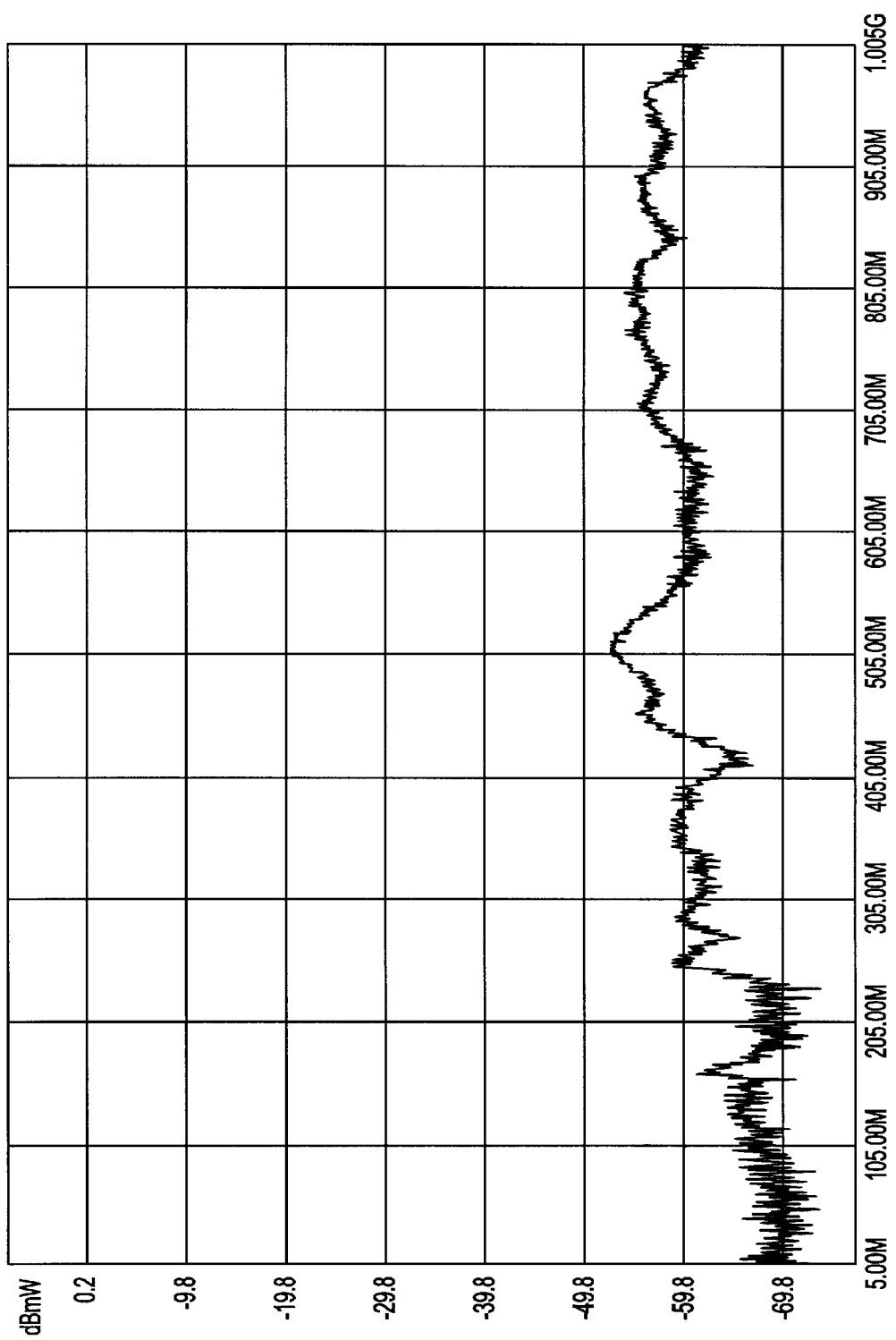

Referring to FIG. 17, a graph of the ambient noise from a test setup that simulates a direct comparison between a conventional relay PCB and one embodiment of the inventive PCB is illustrated. The noise is transmission line reflections using a ferrite clamp and represents the noise floor for the test. The primary frequency of interest is the region below about 150 MHz. FIG. 18 illustrates the noise level on the transmission line when connected to a simulated conventional PCB having foil loops for the relay connections. The noise level increases by an average of about 18 dB. FIG. 19 illustrates the noise on the transmission line when connected to a simulated 2-plane PCB configured in an analogous manner as PCB 92 shown in FIG. 16A. The noise at frequencies below about 400 MHz is very close to the ambient noise levels shown in FIG. 17, and represents an improvement in noise of about 18 dB over a conventional relay PCB.

Figure 20:
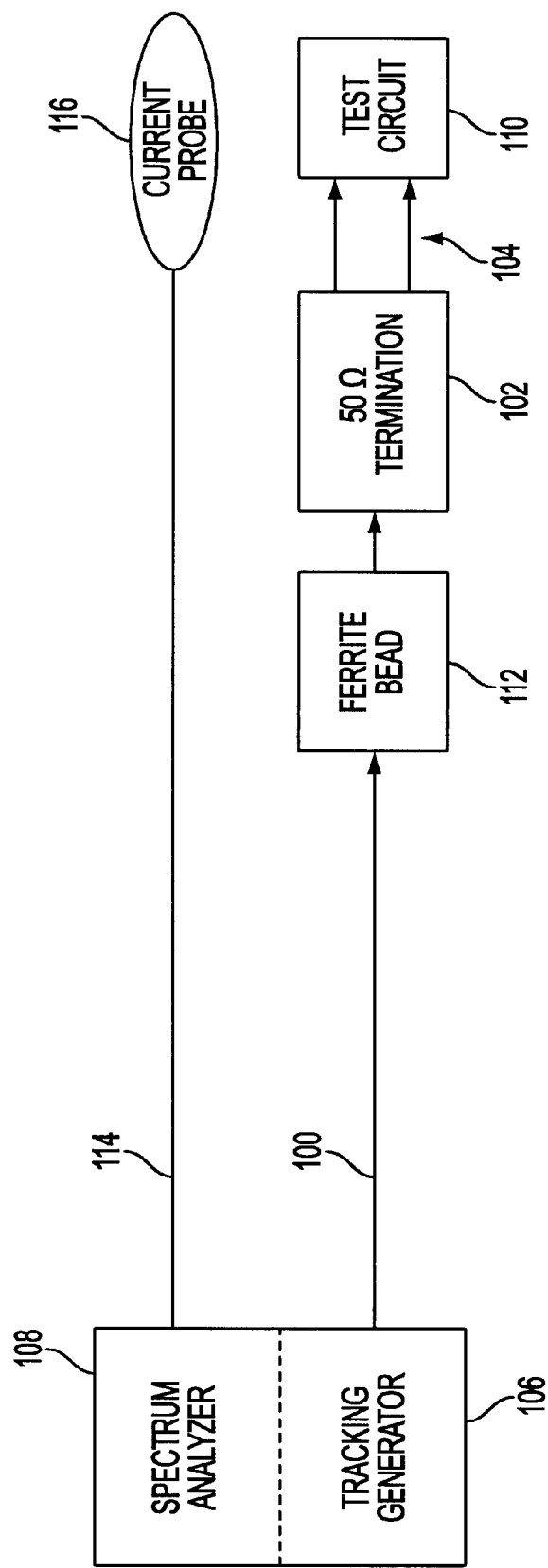
FIG. 20 is a block diagram of the test setup for the noise measurements illustrated in FIGS. 17–19.

Referring to FIG. 20, the test setup for the test results shown in FIGS. 17–19 is illustrated. A short coax cable 100 is terminated with a 50 ohm resistor 102 and a short pair of clip leads 104. The other end of cable 100 is connected to the tracking generator 106 output of a spectrum analyzer 108. The tracking generator 106 provides a sweeping test stimulus that is synchronized with the scan of the spectrum snalyzer 108. The transmission line reflections resulting from the "poor" termination formed by clip leads 104 and the test circuit 110 are minimized by a clip-on ferrite bead 112 near the far end of cable 100. Another relatively short coax cable 114 is terminated with a loop of wire to form a small current probe 116. The other end of cable 114 is connected to the input of the spectrum analyzer 108. Several small pieces of thin metal foil, such as about $3 \frac{1}{2}$ inches by about 2 inches, are cut to shape and folded to form various test circuit models 110 of the PCBs described hereinabove. Clips 104 are attached to the foil test circuit models 110, which may be taped to a non-conductive work surface. The tacking generator 106 energizes the test circuit models 110, and the current probe 116 is then moved over the test circuit models 110 to examine the energy transmitted into the field, which is displayed on the spectrum analyzer 108.

It is to be understood that variations and modifications of the present invention can be made without departing from the scope of the invention. It is also to be understood that the scope of the invention is not to be interpreted as limited to the specific embodiments disclosed herein, but only in accordance with the appended claims when read in light of the forgoing disclosure.

What is claimed is:

1. A multilayered printed circuit board for mounting a relay thereon, comprising:

a first layer having an electrically conductive plane for electrical connection to a common armature contact of the relay, said electrically conductive plane being sized to substantially cover a mounting footprint of the relay; and, a second layer parallel to and electrically separate from said first layer, said second layer having an electrically conducting first section for electrical connection to a normally-open contact of the relay and an electrically conducting second section for electrical connection to a normally-closed contact of the relay, said first and said second sections being electrically separate from each other and in combination with each other being planar and sized to substantially cover the mounting footprint of the relay.

2. The apparatus of claim 1 wherein a plurality of relays are mountable thereon, said first layer including a plurality of said electrically conductive planes, each being electrically separate form each other, and said second layer including a plurality of said electrically conductive first and second sections, one pair each corresponding to each of said electrically conductive planes in said first layer, each of said electrically conductive first and second sections being electrically separate form each other.

3. The apparatus of claim 2 further including a third layer parallel to and electrically separate from said first and said second layers, said third layer being electrically conductive and electrically connected to ground.

4. The apparatus of claim 2 flier including the plurality of relays mounted thereon.

5. The apparatus of claim 4 further including at least one logic circuit component mounted on the printed circuit board adjacent at least one of said plurality of relays.

6. The apparatus of claim 4 further including at least one logic circuit component mounted on a second printed circuit board disposed adjacent at least one of said plurality of relays.

7. A multilayered printed circuit board for mounting a relay thereon, comprising:

a first layer having a first electrically conductive plane for electrical connection to a common armature contact of the relay, said first electrically conductive plane being sized to substantially cover a mounting footprint of the relay;

a second layer parallel to and electrically separate from said first layer, said second layer having a second electrically conductive plane for electrical connection to a normally-open contact of the relay, said second electrically conductive plane being sized to substantially cover the mounting footprint of the relay; and, a third layer parallel to and electrically separate from said first and said second layers, said third layer having a third electrically conductive plane for electrical connection to a normally-closed contact of the relay, said third electrically conductive plane being sized to substantially cover the mounting footprint of the relay.

8. The apparatus of claim 7 wherein a plurality of relays are mountable thereon, said first layer having a plurality of said first electrically conductive planes, each being electrically separate form each other, said second layer having a plurality of said second electrically conductive planes, each being electrically separate form each other, and said third layer having a plurality of said third electrically conductive planes, each being electrically separate form each other, wherein one each of said first, said second, and said third electrically conductive planes are associated with one each of the plurality of relays.

9. The apparatus of claim 8 further including a fourth layer parallel to and electrically separate from said first, said second, and said third layers, said fourth layer being electrically conductive and electrically connected to ground.

10. The apparatus of claim 8 further including the plurality of relays mounted thereon.

11. The apparatus of claim 10 further including at least one logic circuit component mounted on the printed circuit board adjacent at least one of said plurality of relays.

12. The apparatus of claim 10 further including at least one logic circuit component mounted on a second printed circuit board disposed adjacent at least one of said plurality of relays.

* * * * *

UNITED STATES PATENT AND TRADEMARK OFFICE
CERTIFICATE OF CORRECTION

PATENT NO.      : 6,510,058 B1
DATED           : January 21, 2003
INVENTOR(S)     : Raymond Kozakiewicz It is certified that error appears in the above-identified patent and that said Letters Patent is hereby corrected as shown below:

<u>Column 7,</u>
Line 32, replace "flier" with -- further --

Signed and Sealed this

First Day of July, 2003

JAMES E. ROGAN
*Director of the United States Patent and Trademark Office*